United States Patent
Yang et al.

(10) Patent No.: US 11,908,952 B2
(45) Date of Patent: *Feb. 20, 2024

(54) SEMICONDUCTOR DEVICES AND MANUFACTURING METHODS THEREOF

(71) Applicant: Samsung Electronics Co., Ltd., Suwon-si (KR)

(72) Inventors: Jung Gil Yang, Hwaseong-si (KR); Woo Seok Park, Ansan-si (KR); Dong Chan Suh, Suwon-si (KR); Seung Min Song, Hwaseong-si (KR); Geum Jong Bae, Suwon-si (KR); Dong Il Bae, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,737

(22) Filed: Jun. 15, 2022

(65) Prior Publication Data

US 2022/0310852 A1 Sep. 29, 2022

Related U.S. Application Data

(63) Continuation of application No. 16/953,785, filed on Nov. 20, 2020, now Pat. No. 11,393,929, which is a
(Continued)

(30) Foreign Application Priority Data

Aug. 29, 2017 (KR) .................. 10-2017-0109428

(51) Int. Cl.
*H01L 29/786* (2006.01)
*H01L 29/423* (2006.01)
(Continued)

(52) U.S. Cl.
CPC ........ *H01L 29/78696* (2013.01); *B82Y 10/00* (2013.01); *H01L 29/0673* (2013.01);
(Continued)

(58) Field of Classification Search
CPC ......... H01L 29/78696; H01L 29/41725; H01L 29/1033; H01L 29/0847; H01L 29/42392;
(Continued)

(56) References Cited

U.S. PATENT DOCUMENTS 7,648,883 B2 1/2010 Park
9,343,300 B1 5/2016 Jacob et al.
(Continued)

FOREIGN PATENT DOCUMENTS

CN 101060085 A 10/2007
DE 102014222378 A1 5/2015
(Continued)

OTHER PUBLICATIONS

"C.-H. Jan, et al., "A 14nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products," IEEE VLSI 2015 (2 pages)".

(Continued)

*Primary Examiner* — Changhyun Yi
(74) *Attorney, Agent, or Firm* — Myers Bigel, P.A.

(57) ABSTRACT

A semiconductor device includes a substrate, a plurality of channel layers stacked on the substrate, a gate electrode surrounding the plurality of channel layers, and embedded source/drain layers on opposing sides of the gate electrode. The embedded source/drain layers each have a first region and a second region on the first region. The second region has a plurality of layers having different compositions.

18 Claims, 14 Drawing Sheets

Related U.S. Application Data continuation of application No. 15/900,175, filed on Feb. 20, 2018, now Pat. No. 10,872,983.

(51) Int. Cl.
| | | |
|---|---|---|
| *H01L 29/10* | (2006.01) | |
| *H01L 29/161* | (2006.01) | |
| *H01L 29/08* | (2006.01) | |
| *H01L 29/66* | (2006.01) | |
| *H01L 29/775* | (2006.01) | |
| *B82Y 10/00* | (2011.01) | |
| *H01L 29/06* | (2006.01) | |

(52) U.S. Cl.
CPC ...... *H01L 29/0847* (2013.01); *H01L 29/1033* (2013.01); *H01L 29/161* (2013.01); *H01L 29/42392* (2013.01); *H01L 29/66439* (2013.01); *H01L 29/66545* (2013.01); *H01L 29/775* (2013.01); *H01L 29/78618* (2013.01)

(58) Field of Classification Search
CPC ......... H01L 29/0665; H01L 2029/7858; H01L 29/0653; H01L 29/161; H01L 29/66439; H01L 29/66545; H01L 29/775; H01L 29/78618

See application file for complete search history.

(56) References Cited

U.S. PATENT DOCUMENTS

| | | | |
|---|---|---|---|
| 9,349,650 | B2 | 5/2016 | Chan et al. |
| 9,425,259 | B1 | 8/2016 | Suk et al. |
| 9,449,975 | B1 | 9/2016 | Ching et al. |
| 9,577,100 | B2 | 2/2017 | Cheng et al. |
| 9,653,547 | B1 | 5/2017 | Chang et al. |
| 11,393,929 | B2 * | 7/2022 | Yang ................. H01L 29/78696 |
| 2005/0266645 | A1 | 12/2005 | Park |
| 2006/0049429 | A1 | 3/2006 | Kim et al. |
| 2006/0286755 | A1 | 12/2006 | Brask et al. |
| 2007/0249130 | A1 | 10/2007 | Anderson et al. |
| 2011/0058116 | A1 | 3/2011 | Yamazaki et al. |
| 2011/0147828 | A1 | 6/2011 | Murthy et al. |
| 2014/0001441 | A1 | 1/2014 | Kim et al. |
| 2014/0264276 | A1 | 9/2014 | Chang et al. |
| 2015/0021696 | A1 * | 1/2015 | Sung ................. H01L 29/66636 257/368 |
| 2015/0311340 | A1 | 10/2015 | Ma et al. |
| 2015/0372104 | A1 | 12/2015 | Liu et al. |
| 2016/0027870 | A1 | 1/2016 | Cheng et al. |
| 2016/0118483 | A1 | 4/2016 | Flachowsky et al. |
| 2016/0172358 | A1 | 6/2016 | Hatcher et al. |
| 2016/0196983 | A1 | 7/2016 | Chen et al. |
| 2016/0204195 | A1 | 7/2016 | Wen et al. |
| 2016/0211371 | A1 | 7/2016 | Tsai et al. |
| 2016/0293702 | A1 | 10/2016 | Chen et al. |
| 2016/0365357 | A1 | 12/2016 | Kim et al. |
| 2017/0005195 | A1 | 1/2017 | Ching et al. |
| 2017/0077244 | A1 * | 3/2017 | Chang ................. H01L 29/0657 |
| 2017/0117410 | A1 * | 4/2017 | Hu ........................ H01L 29/165 |
| 2017/0222024 | A1 | 8/2017 | Bergendahl et al. |
| 2018/0151683 | A1 | 5/2018 | Yeo et al. |
| 2018/0151730 | A1 * | 5/2018 | Ma ........................ H01L 29/167 |
| 2018/0175194 | A1 | 6/2018 | Reboh et al. |
| 2018/0358436 | A1 | 12/2018 | Jambunathan et al. |

FOREIGN PATENT DOCUMENTS

| | | |
|---|---|---|
| EP | 3127862 A1 | 2/2017 |
| JP | 2011029503 A | 2/2011 |
| KR | 20010028838 A | 4/2001 |
| KR | 100958055000 | 5/2010 |
| KR | 20160147626 A | 12/2016 |
| KR | 20170003354 A | 1/2017 |
| KR | 20170009667 A | 1/2017 |
| TW | 201338164 A | 9/2013 |
| TW | 1537657 | 6/2016 |
| TW | 201635439 A | 10/2016 |
| WO | 2015190852 A1 | 12/2015 |
| WO | 2017111850 A1 | 6/2017 |

OTHER PUBLICATIONS

"India Office Action dated Jul. 24, 2020 for Indian Application No. 201834021486".

"Search Report and Written Opinion issued for corresponding Singapore Patent Application No. 10201805116Y, dated Oct. 4, 2018 (13 pages)".

"Chinese Office Action in Corresponding Application No. 201810596906.2, dated Mar. 30, 2023, 6 pages (18 total pages)".

* cited by examiner

SEMICONDUCTOR DEVICES AND MANUFACTURING METHODS THEREOF

CROSS-REFERENCE TO RELATED APPLICATIONS

This patent application is a continuation of U.S. patent application Ser. No. 16/953,785 filed Nov. 20, 2020, which is a continuation of U.S. patent application Ser. No. 15/900, 175 filed Feb. 20, 2018, which claims benefit and priority under 35 U.S.C. § 119 to Korean Patent Application No. 10-2017-0109428, filed on Aug. 29, 2017 in the Korean Intellectual Property Office, and the entire contents of each above-identified application are incorporated herein by reference.

BACKGROUND

1. Field

The present inventive concepts relate to semiconductor devices and manufacturing methods thereof.

2. Description of Related Art

In order to increase the density of semiconductor devices, transistors having a gate-all-around (GAA) structure have been proposed. Such a GAA structure may include forming a silicon body having a nanowire shape on a substrate and forming a gate to encase the silicon body.

Since transistors having such a GAA structure use a three-dimensional channel, the transistors may have a reduced scale. Further, the transistor may achieve an improved current control ability without increasing the gate length. Moreover, the transistor may suppress a short channel effect, which may affect the electrical potential of a channel region by a drain voltage.

SUMMARY

An aspect of the present inventive concepts may provide semiconductor devices having improved alternating current (AC) characteristics by significantly reducing an enlargement of the gate length thereof.

An aspect of the present inventive concepts may provide methods of manufacturing a semiconductor device that may facilitate a manufacturing process thereof.

According to an aspect of the present inventive concepts, a semiconductor device may include: a substrate; a plurality of channel layers stacked on the substrate; a gate electrode surrounding the plurality of channel layers; and embedded source/drain layers on opposing sides of the gate electrode, the embedded source/drain layers each having a first region and a second region, on the first region, the second region having a plurality of layers having different compositions.

According to an aspect of the present inventive concepts, a semiconductor device may include: a substrate; a plurality of channel layers stacked on the substrate, the plurality of channel layers extending in a first direction; a gate electrode surrounding the plurality of channel layers, the gate electrode extending in a second direction, intersecting the first direction; and embedded source/drain layers on opposing sides of the gate electrode, in which at least one first channel layer of the plurality of channel layers may have a region having a first length extending farther in the first direction than a second length of a second channel layer of the plurality of channel layers that is adjacent to the first channel layer. A top channel layer of the plurality of channel layers that is farthest from the substrate may have a length extending in the first direction that decreases toward the substrate.

According to an aspect of the present inventive concepts, a method of manufacturing a semiconductor device may include: forming a fin structure on a substrate, the fin structure having a plurality of sacrificial layers and a plurality of semiconductor layers alternately stacked; forming a dummy gate intersecting the fin structure; forming recesses on opposing sides of the dummy gate by anisotropically dry etching the fin structure; extending the recesses using an isotropic dry etching process to form extended recesses; and forming embedded source/drain layers within the extended recesses.

According to an aspect of the present inventive concepts, a semiconductor device may include: a substrate; an embedded source/drain layer on the substrate; at least two channel layers stacked on the substrate adjacent the embedded source/drain layer; a gate electrode on the substrate and including a portion of the gate electrode that is between the at least two channel layers; a gate insulating layer including a first material that is between the embedded source/drain layer and the portion of the gate electrode that is between the at least two channel layers; and an interfacial layer including a second material that is between the embedded source/drain layer and the at least two channel layers.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, the example embodiments of the present inventive concepts will be described below with reference to the attached drawings.

Figure 1:
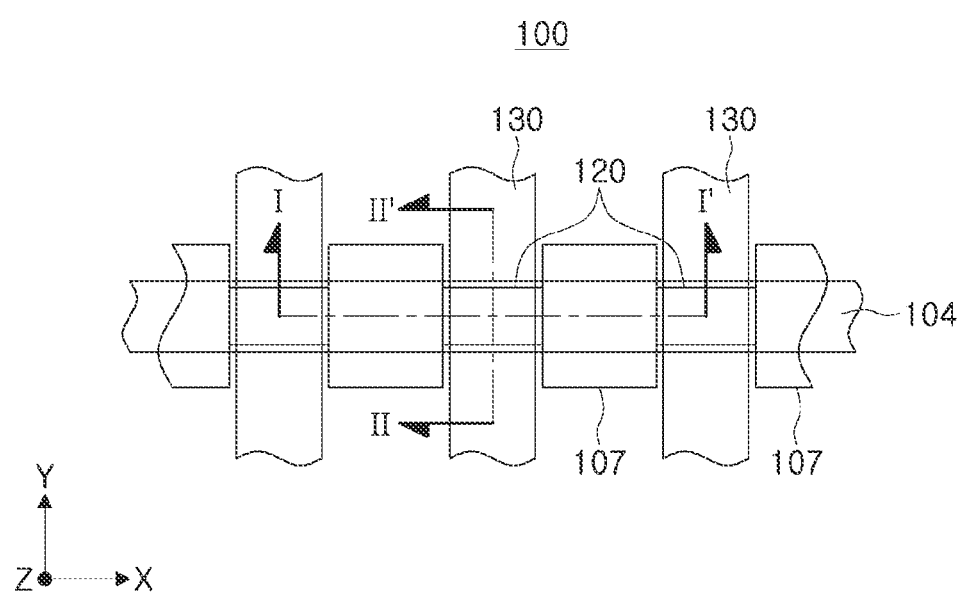
FIG. 1 is a plan view of a semiconductor device, according to an example embodiment of the present inventive concepts.

FIG. 1 is a layout of a semiconductor device, according to an example embodiment of the present inventive concepts.

Referring to FIG. 1, a semiconductor device 100, according to an example embodiment of the present inventive concepts, may include a protrusion portion 104 disposed on a substrate, and a plurality of gate electrodes 130 intersecting the protrusion portion 104. The protrusion portion 104 may extend in a first direction (for example, an X-axis direction). The gate electrodes 130 may extend in a second direction (for example, a Y-axis direction) intersecting the first direction. Embedded source/drain layers 107 may be disposed on both (e.g., opposing) sides of each of the gate electrodes 130. A plurality of channel layers 120 intersecting the gate electrodes 130 in the first direction may be disposed between the embedded source/drain layers 107. The gate electrodes 130 may surround the channel layers 120.

Figure 2:
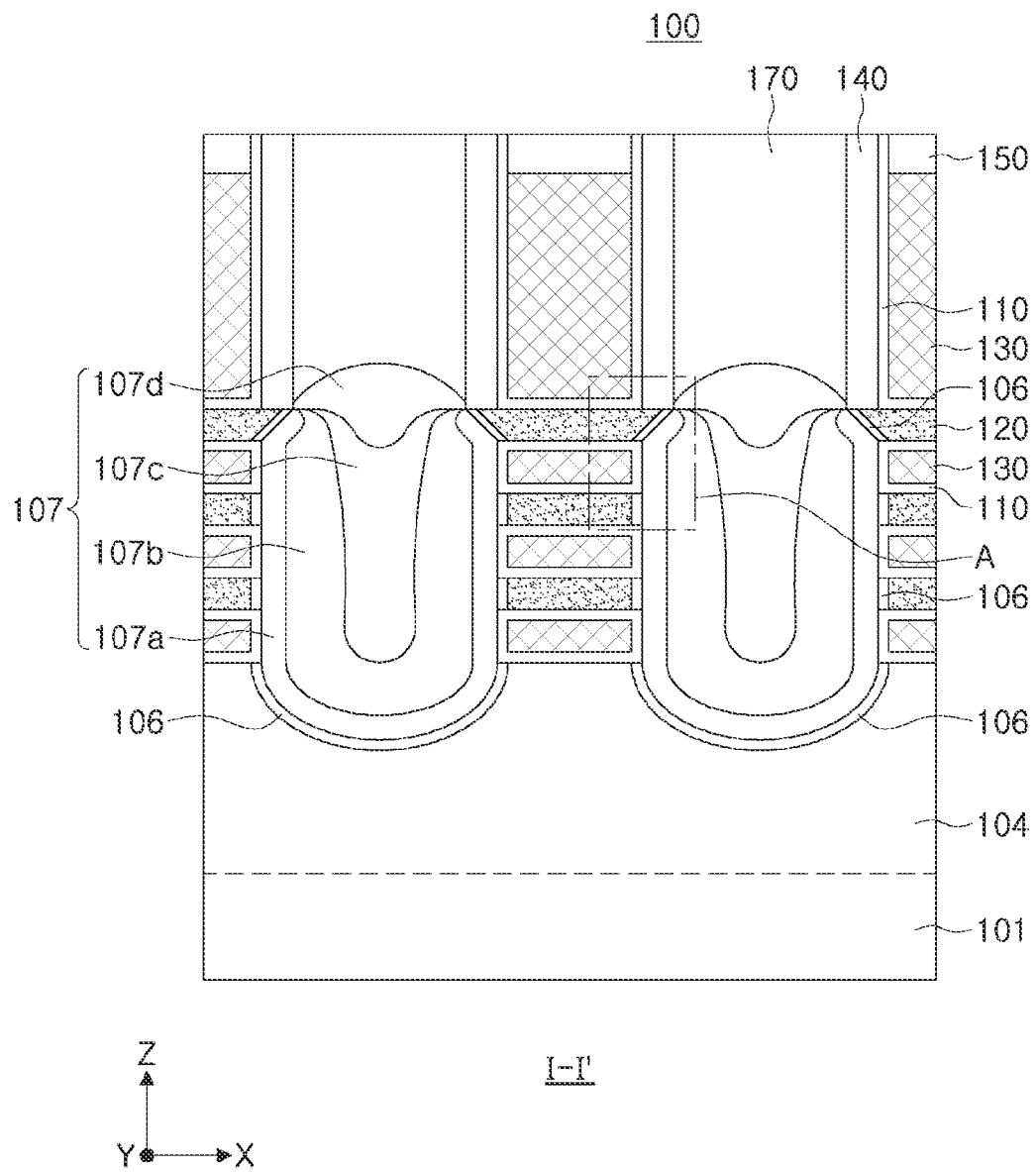
FIG. 2 is a cross-sectional view taken along line I-I' of the semiconductor device illustrated in FIG. 1.
Figure 3:
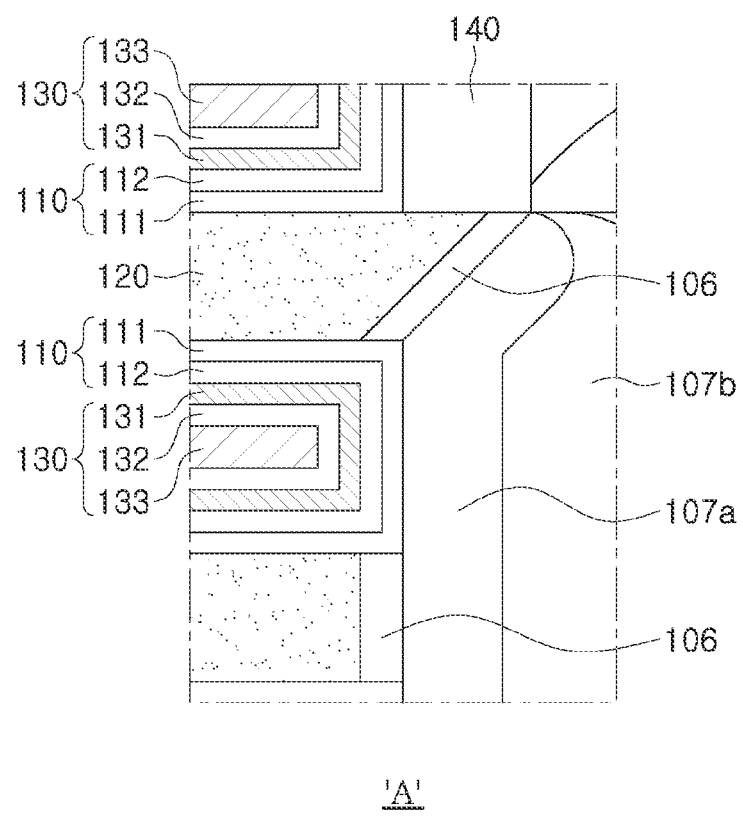
FIG. 3 is an enlarged view of region A of the semiconductor device illustrated in FIG. 2.
Figure 4:
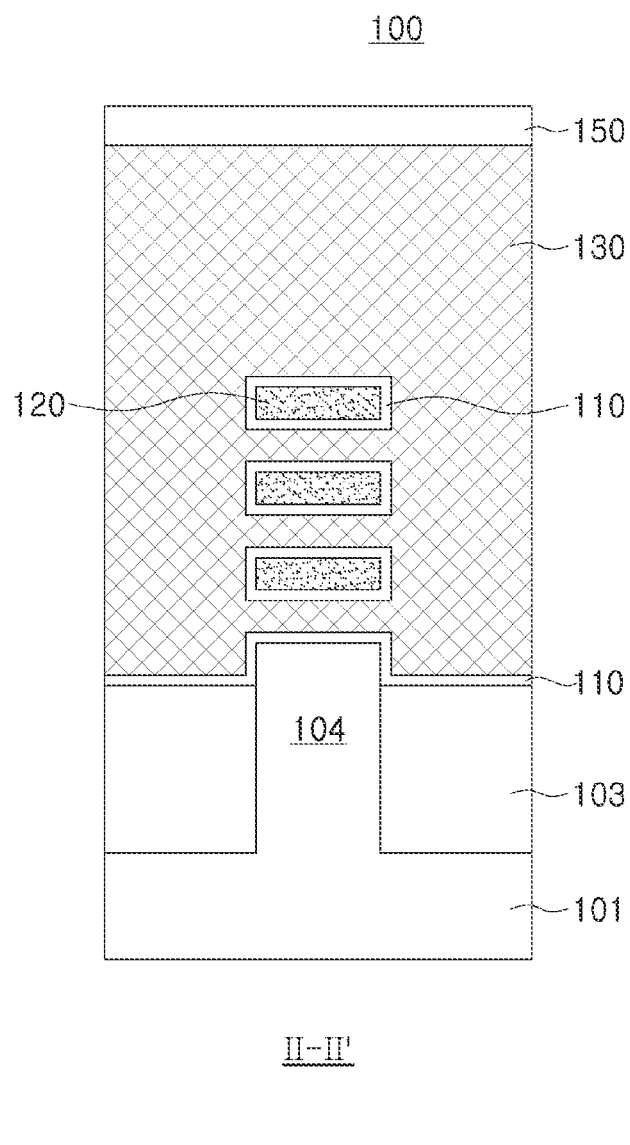
FIG. 4 is a cross-sectional view taken along line II-II' of the semiconductor device illustrated in FIG. 1.

FIG. 2 is a cross-sectional view taken along line I-I' of the semiconductor device illustrated in FIG. 1. FIG. 3 is an enlarged view of region A of the semiconductor device illustrated in FIG. 2. FIG. 4 is a cross-sectional view taken along line II-II' of the semiconductor device illustrated in FIG. 1.

Referring to FIGS. 2 through 4, the semiconductor device 100, according to an example embodiment of the present inventive concepts, may include a substrate 101, an isolation insulating layer 103, an embedded source/drain layer 107, a gate insulating layer 110, a gate electrode 130, a spacer 140, a protective layer 150, and an interlayer insulating layer 170.

The substrate 101 may be a semiconductor substrate. The semiconductor substrate may include a group IV semiconductor material, a group III-V compound semiconductor material, and/or a group II-VI compound semiconductor material. The substrate 101 may be a silicon on insulator (SOI) substrate.

The substrate 101 may include the protrusion portion 104 extending in the first direction (for example, the X-axis direction). In some embodiments, the protrusion portion 104 may include a fin-type active region. The isolation insulating layer 103 may be disposed on the substrate 101 and on lateral surfaces of the protrusion portion 104 of the substrate 101. An upper surface of the isolation insulating layer 103 may be lower than an upper surface of the protrusion portion 104. An upper portion of the protrusion portion 104 may be farther from an upper surface of the substrate 101 (e.g., may protrude more from the substrate 101) than the upper surface of the isolation insulating layer 103. The protrusion portion 104 may be referred to as an active region.

The channel layers 120 extending in the first direction (for example, the X-axis direction) on the protrusion portion 104 may be spaced apart from each other in a third direction (for example, a Z-axis direction) perpendicular to an upper surface of the substrate 101. The gate electrodes 130 may extend in the second direction intersecting the protrusion portion 104. The embedded source/drain layers 107 connected to the channel layers 120 may be disposed on both sides of each of the gate electrodes 130. The channel layers 120 may be disposed between the embedded source/drain layers 107. In some embodiments, a plurality of the channel layers 120 may be arranged (e.g., stacked) in the third direction.

At least one of the channel layers 120 may include a region in which a length of the at least one channel layer 120 may be greater than that of another channel layer 120 adjacent in the third direction (for example, the Z-axis direction) to the at least one channel layer 120. A top channel layer 120 of the channel layers 120 may include a region in which a length of the top channel layer 120 may be greater than that of another channel layer 120 adjacent in the third direction (for example, the Z-axis direction) to the top channel layer 120. As used herein, the top channel layer 120 may be a channel layer 120 of the plurality of channel layers 120 that are stacked in the third direction that is furthest from the substrate 101. In some embodiments, the length of the top channel layer 120 may be greater than that of another channel layer 120 between the top channel layer 120 and the substrate 101. A length of an upper portion of the top channel layer 120 may be greater than that of a lower portion of the top channel layer 120. The top channel layer 120 has a length extending in the first direction (for example, the X-axis direction) and the length of the top channel layer 120 may decrease toward the substrate 101. A length of at least a region of the top channel layer 120 in the first direction may be greater than that of the gate electrode 130 in the first direction. The top channel layer 120 may have an inclined lateral surface. In some embodiments of the present inventive concepts, lateral surfaces of the top channel layer 120 adjacent to the embedded source/drain layers 107 may be flat surfaces inclined with respect to an upper surface of the substrate 101.

Figure 5:
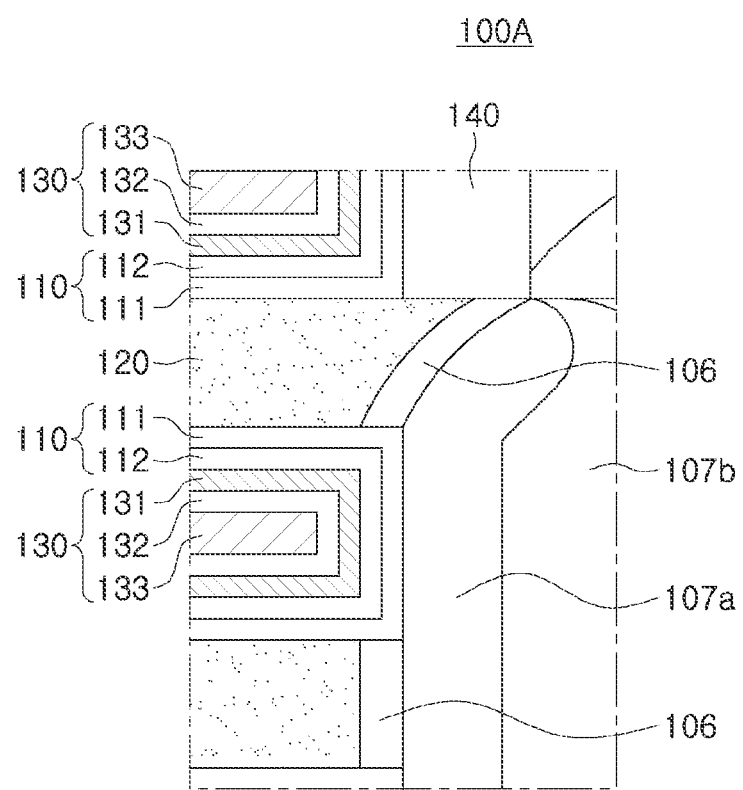
FIG. 5 is a partially enlarged view of a semiconductor device, according to an example embodiment of the present inventive concepts, and is a modified example of the semiconductor device illustrated in FIG. 3.

In some embodiments of the present inventive concepts, the lateral surfaces of the top channel layer 120 adjacent to the embedded source/drain layers 107, may be curved surfaces (refer to FIG. 5) inclined with respect to an upper surface of the substrate 101.

In an example embodiment of the present inventive concepts, in addition to the top channel layer 120, a bottom channel layer 120 of the channel layers 120 may also include a region in which a length of the bottom channel layer 120 may be greater than that of another channel layer 120 adjacent to the bottom channel layer 120 in the third direction (for example, the Z-axis direction). As used herein, the bottom channel layer 120 may be a channel layer 120 of the plurality of channel layers 120 that are stacked in the third direction that is closest to the substrate 101. In contrast to the top channel layer 120, a length of a lower portion of the bottom channel layer 120 may be greater than that of an upper portion of the bottom channel layer 120. The lower portion of the bottom channel layer 120 may be closer to the substrate 101 than the upper portion of the bottom channel layer 120. The bottom channel layer 120 has a length extending in the first direction (for example, the X-axis direction) and the length of the bottom channel layer 120 may increase toward the substrate 101. A length of at least a region of the bottom channel layer 120 in the first direction may be greater than that of the gate electrode 130 in the first direction. The lateral surfaces of the bottom channel layer 120 adjacent to the embedded source/drain layers 107 may be inclined flat surfaces or inclined curved surfaces.

Interfacial layers 106 may be disposed between the embedded source/drain layers 107 and the channel layers 120. The interfacial layers 106 may be disposed between the embedded source/drain layers 107 and the substrate 101 and/or between the embedded source/drain layers 107 and the protrusion portion 104.

Each of the embedded source/drain layers 107 may include a liner layer 107a, and a first epitaxial layer 107b, a second epitaxial layer 107c, and a third epitaxial layer 107d (referred to herein as first to third epitaxial layers 107b to 107d) sequentially stacked on the liner layer 107a. In some embodiments, the first to third epitaxial layers 107b to 107d may have different compositions. The interfacial layers 106 may be disposed between the liner layer 107a and the channel layers 120 and/or between the liner layer 107a and the substrate 101. The embedded source/drain layer 107 may include a first region and a second region. The liner layer 107a may form the first region of the embedded source/drain layer 107, and the first epitaxial layer 107b, the second epitaxial layer 107c, and the third epitaxial layer 107d may form the second region of the embedded source/drain layer 107.

The liner layer 107a may include a semiconductor material that is substantially the same as that of the channel layers 120, and the interfacial layers 106 may include a semiconductor material that is substantially the same as that of the first to third epitaxial layers 107b to 107d. For example, the interfacial layers 106 may include silicon germanium (SiGe), and the liner layers 107a may include silicon (Si), though the present inventive concepts are not limited thereto. For example, the first to third epitaxial layers 107b to 107d may include SiGe, though the present inventive concepts are not limited thereto. A germanium content of the third epitaxial layer 107d may be higher than that of the second epitaxial layer 107c, and a germanium content of the second epitaxial layer 107c may be higher than that of the first epitaxial layer 107b. For example, the germanium content may increase in a direction toward the third epitaxial layer 107d from the first epitaxial layer 107b. A germanium content of the interfacial layers 106 may be lower than that of the first epitaxial layer 107b.

For example, the interfacial layers 106 may include 5 at % to 15 at % germanium (Ge), the first epitaxial layer 107b may include 17 at % to 27 at % Ge, the second epitaxial layer 107c may include 37 at % to 47 at % Ge, and the third epitaxial layer 107d may include 50 at % to 60 at % Ge.

The liner layer 107a, the first epitaxial layer 107b, the second epitaxial layer 107c, and the third epitaxial layer 107d may be doped with, for example, p-type impurities. The p-type impurities may be injected in situ during a selective epitaxial growth (SEG) process or by a following ion implantation process.

A thickness of respective ones of the interfacial layers 106 may be less than that of the liner layer 107a. In some embodiments, thicknesses of the first to third epitaxial layers 107b to 107d may be different from one another.

In an example embodiment of the present inventive concepts, each of the embedded source/drain layers 107 may include the liner layer 107a and two epitaxial layers, having different compositions. In an example embodiment, each of the embedded source/drain layers 107 may include the liner layer 107a and an epitaxial layer having a continuously varying composition.

An upper surface of the embedded source/drain layer 107 may be higher than that of the top channel layer 120. However, the present inventive concepts are not limited thereto. In some embodiments, the upper surface of the embedded source/drain layer 107 may be disposed on the same level as the top channel layer 120. The upper surface of the embedded source/drain layer 107 may be a convex curved surface. However, the present inventive concepts are not limited thereto.

Portions of the gate electrodes 130 may be disposed between the embedded source/drain layers 107 in the first direction (for example, the X-axis direction), and may extend in the second direction (for example, the Y-axis direction) intersecting the first direction on the substrate 101. The gate electrodes 130 and the embedded source/drain layers 107 may be insulated by the gate insulating layers 110. The gate electrodes 130 may surround the channel layers 120. The gate insulating layers 110 may be disposed between the gate electrodes 130 and the channel layers 120 and between the gate electrodes 130 and the spacers 140. The gate electrode 130 may also be formed on the isolation insulating layer 103. The gate insulating layer 110 may also be disposed between the gate electrode 130 and the isolation insulating layer 103.

The spacers 140 may be disposed on both sidewalls of the gate electrode 130 to extend in the same direction as that of the gate electrode 130. The spacers 140 may be formed of, for example, a silicon oxynitride, such as SiON, a silicon nitride, such as SiN, SiOC, SiOCN, SiBCN, or any combination thereof.

The protective layer 150 may be disposed on the gate electrode 130 to protect the gate electrode 130. The protective layer 150 may include, for example, a silicon nitride. The interlayer insulating layer 170 may cover the embedded source/drain layer 107. An upper surface of the interlayer insulating layer 170 may be coplanar with that of the protective layer 150.

Referring to FIG. 3, the gate insulating layer 110 may include a plurality of layers. In an example embodiment, the gate insulating layer 110 may include a first insulating layer 111 and a second insulating layer 112. The first insulating layer 111 and the second insulating layer 112 may have different permittivities. The permittivity of the second insulating layer 112 may be greater than that of the first insulating layer 111. In some embodiments, the second insulating layer 112 may be disposed closer to the gate electrode 130 than the first insulating layer 111. For example, the first insulating layer 111 may be disposed closer to the channel layer 120 than the second insulating layer 112. The second insulating layer 112 having a higher level of permittivity than the first insulating layer 111 may have a thickness greater than that of the first insulating layer 111.

The second insulating layer 112 having a higher level of permittivity than the first insulating layer 111 may include a high-k dielectric material. The high-k dielectric material may, for example, be any one among an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or any combination thereof.

In some embodiments, the gate electrode 130 may include a plurality of metal layers. In some embodiments, the plurality of metal layers included in the gate electrode 130 may be disposed between the channel layers 120. A barrier metal layer 131 may be disposed adjacent to the gate insulating layer 110, a work function metal layer 132 may be disposed on the barrier metal layer 131, and a gate metal layer 133 may be disposed on the work function metal layer 132. In some embodiments, a space between the channel layers 120 may only be filled with the gate insulating layer 110, the barrier metal layer 131, and the work function metal layer 132.

The barrier metal layer 131 may, for example, include a metal nitride, such as TiN, TaN, TaSiN, TiSiN, or the like. The work function metal layer 132 may determine a threshold voltage of the semiconductor device 100. In an example embodiment, the work function metal layer 132 may include a plurality of metal layers stacked on each other. For example, the work function metal layer 132 may include ruthenium (Ru), palladium (Pd), platinum (Pt), cobalt (Co), nickel (Ni), or any combination thereof. The gate metal layer 133 may be formed, for example, of a metallic material, such as tungsten (W) or the like.

Referring to FIG. 4, the channel layers 120 disposed on the substrate 101 may be spaced apart from each other in the third direction (for example, the Z-axis direction). The gate insulating layer 110 and the gate electrode 130 may be disposed between the channel layers 120 to separate the channel layers 120 from each other. The channel layers 120 may be surrounded by the gate insulating layers 110 and the gate electrode 130. The channel layers 120 may have a sheet shape, having a width in the second direction (for example, in the Y-axis direction) greater than a thickness thereof in the third direction. FIG. 4 illustrates edges of the channel layers 120 as having an angular shape. However, the present inventive concepts are not limited thereto. The edges of the channel layers 120 may have a curvature.

Figure 6:
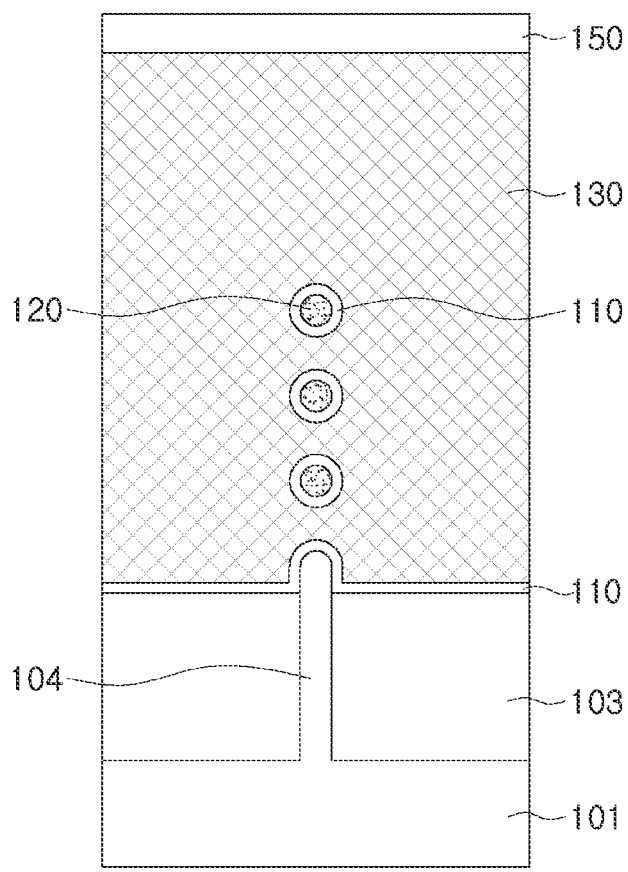
FIG. 6 is a cross-sectional view of a semiconductor device, according to an example embodiment of the present inventive concepts, and is a modified example of the semiconductor device illustrated in FIG. 4.

In some embodiments, the channel layers 120 may have a wire shape with a rounded cross section or an elliptical cross section (refer to FIG. 6).

Figure 7:
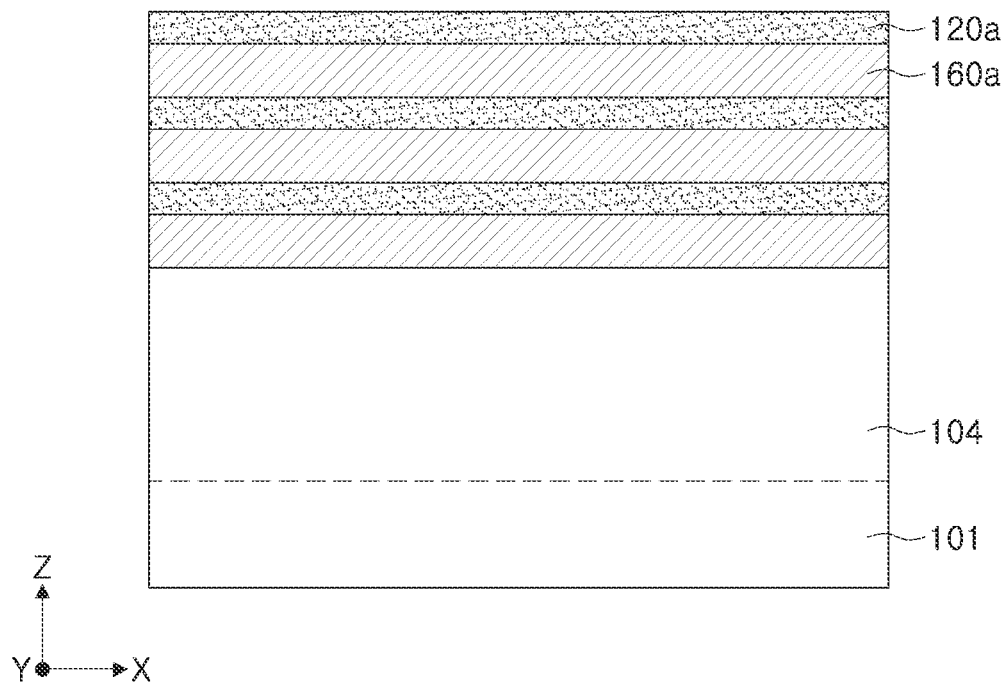
FIGS. 7 to 15 are views illustrating a method of manufacturing the semiconductor device illustrated in FIG. 1, according to embodiments of the present inventive concepts.
Figure 8:
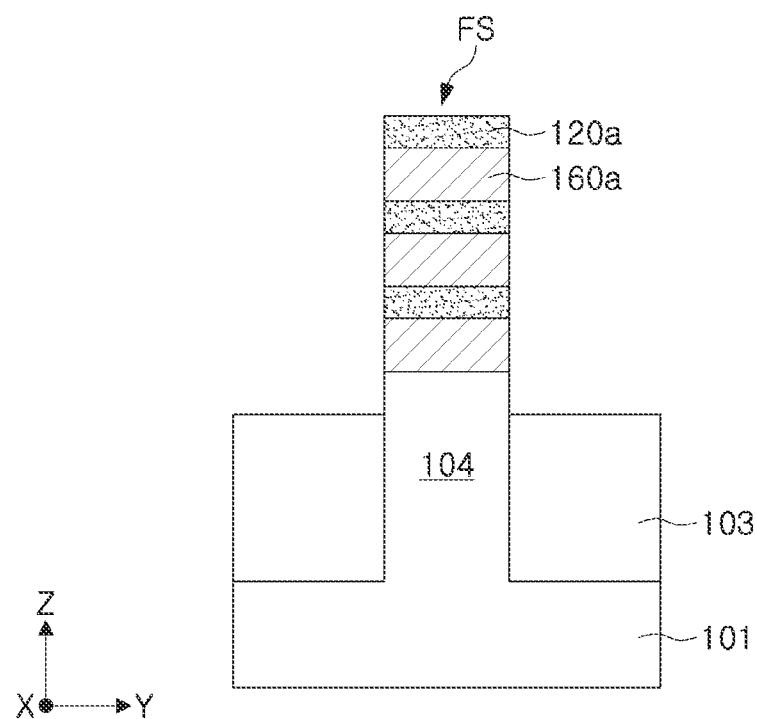
Figure 9:
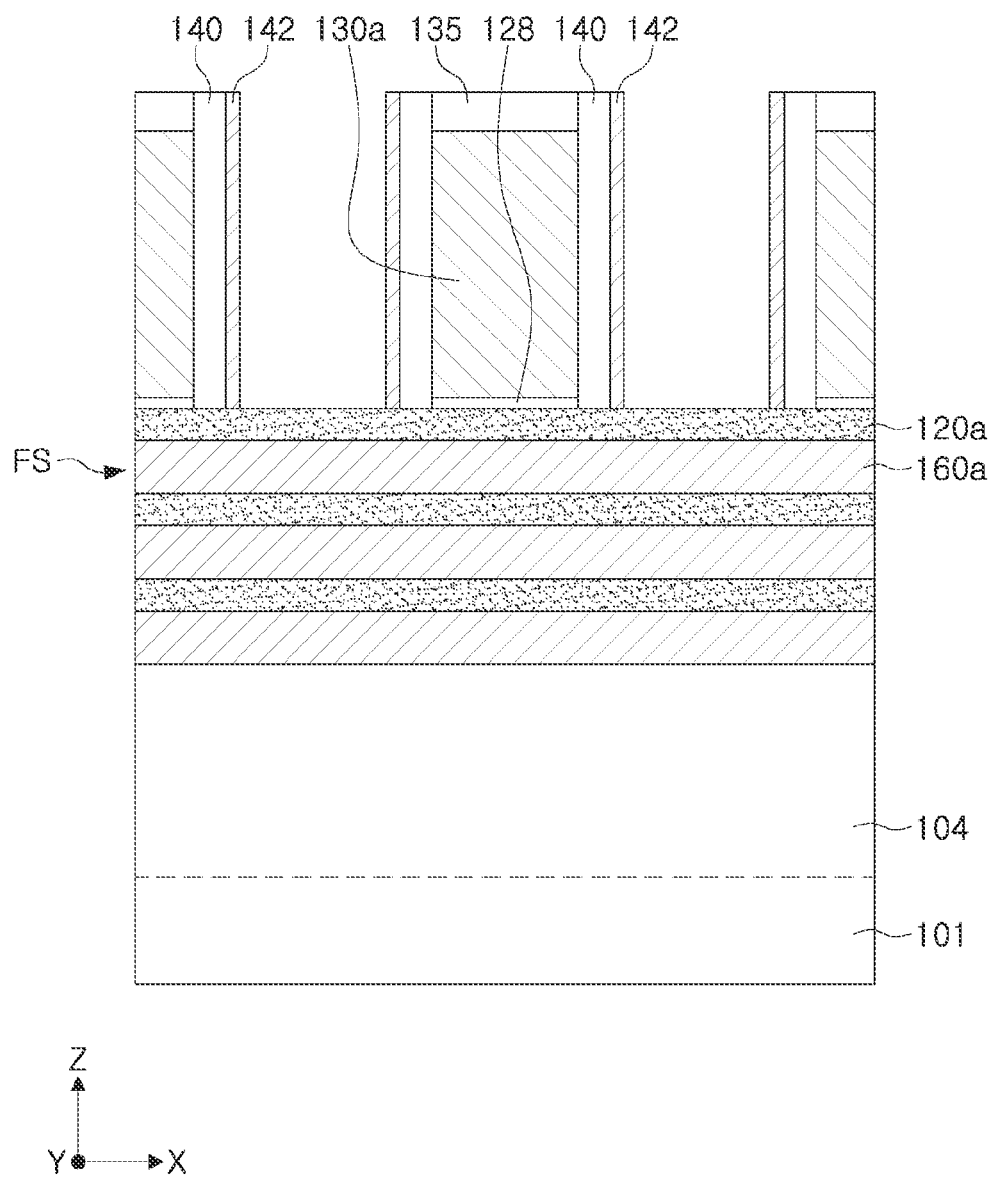
Figure 10:
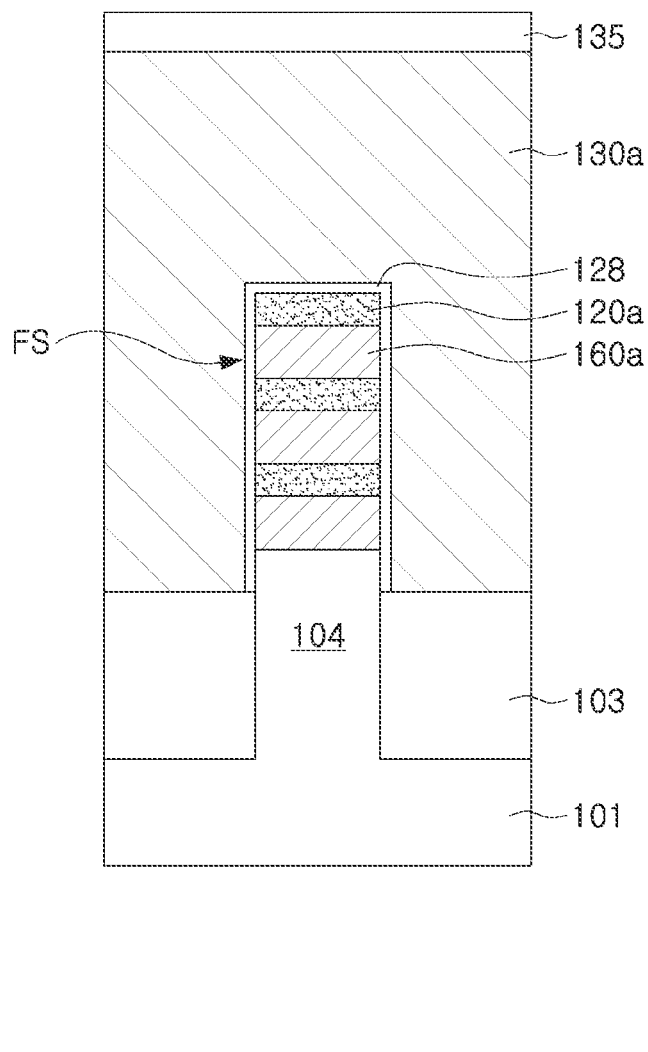

FIGS. 7 to 15 are views illustrating a method of manufacturing the semiconductor device 100 illustrated in FIG. 1, according to embodiments of the present inventive concepts. FIGS. 7, 9, 11, 12, 13, 14, and 15 are cross-sectional views taken along line I-I' of FIG. 1, and FIGS. 8 and 10 are cross-sectional views taken along line of FIG. 1.

Referring to FIG. 7, a plurality of sacrificial layers 160a and a plurality of semiconductor layers 120a may be alternately stacked on a substrate 101.

A sacrificial layer 160a may first be formed on the substrate 101, and a semiconductor layer 120a may be formed on the sacrificial layer 160a. Another sacrificial layer 160a may be repeatedly formed on the semiconductor layer 120a. By repeating such a process, a stack structure having the semiconductor layer 120a disposed on the top thereof may be formed. FIG. 7 illustrates the stack structure as having three sacrificial layers 160a and three semiconductor layers 120a. However, the present inventive concepts are not limited thereto. The number of the sacrificial layers 160a and the semiconductor layers 120a stacked on the substrate 101 may be variously changed. In an example embodiment, one sacrificial layer 160a and one semiconductor layer 120a may be stacked on the substrate 101.

The semiconductor layers 120a may include a first semiconductor material, and the sacrificial layers 160a may include a second semiconductor material having etch selectivity with respect to the semiconductor layers 120a. For example, the semiconductor layers 120a may include Si, and the sacrificial layers 160a may include SiGe. In some embodiments, the sacrificial layers 160a may include SiGe, having a germanium content of 30 at %.

In some embodiments, respective thicknesses of the semiconductor layers 120a and the sacrificial layers 160a may be variously changed. Respective thicknesses of the semiconductor layers 120a and the sacrificial layers 160a may be several nanometers to several tens of nanometers. For example, a thickness of the sacrificial layers 160a may be greater than that of the semiconductor layers 120a.

Referring to FIG. 8, a fin structure FS may be formed by selectively removing portions of the semiconductor layers 120a and the sacrificial layers 160a. The fin structure FS may extend in a first direction (for example, an X-axis direction) on the substrate 101.

The fin structure FS may be formed by forming a mask pattern on the substrate 101, having the semiconductor layers 120a and the sacrificial layers 160a stacked thereon, and by performing an anisotropic etching process. The fin structure FS may include the semiconductor layers 120a and the sacrificial layers 160a alternately stacked on each other. In the process of forming the fin structure FS, a protrusion portion 104 may be formed on the substrate 101 by removing a portion of the substrate 101. The protrusion portion 104 of the substrate 101 may form the fin structure FS along with the semiconductor layers 120a and the sacrificial layers 160a. An isolation insulating layer 103 may be formed on a region from which the portion of the substrate 101 has been removed. The isolation insulating layer 103 may cover a portion of lateral surfaces of the protrusion portion 104. An upper surface of the isolation insulating layer 103 may be lower than an upper surface of the protrusion portion 104. For example, the protrusion portion 104 of the substrate 101 may protrude above the isolation insulating layer 103.

After the fin structure FS and the isolation insulating layer 103 are formed, the mask pattern may be removed.

Referring to FIGS. 9 and 10, dummy gates 130a may be formed to intersect the fin structure FS. Spacers 140 and sacrificial spacers 142 may be formed on sidewalls of each of the dummy gates 130a. A dummy insulating layer 128 may be disposed between the dummy gates 130a and the fin structure FS. A capping layer 135 may further be formed on the dummy gate 130a.

The dummy gate 130a may extend in a second direction (for example, a Y-axis direction). The dummy insulating layer 128, the spacers 140, and the sacrificial spacers 142 may extend in the same direction as that of the dummy gate 130a. The dummy gate 130a and the dummy insulating layer 128 may be on the fin structure FS protruding on the isolation insulating layer 103.

The dummy gate 130a may be formed of a semiconductor material, such as, for example, polysilicon or the like. The spacers 140 may be formed, for example, of a silicon oxynitride, such as SiON, a silicon nitride, such as SiN, SiOC, SiOCN, SiBCN, or any combination thereof. The dummy insulating layer 128 may be formed, for example, of a silicon oxide.

Figure 11:
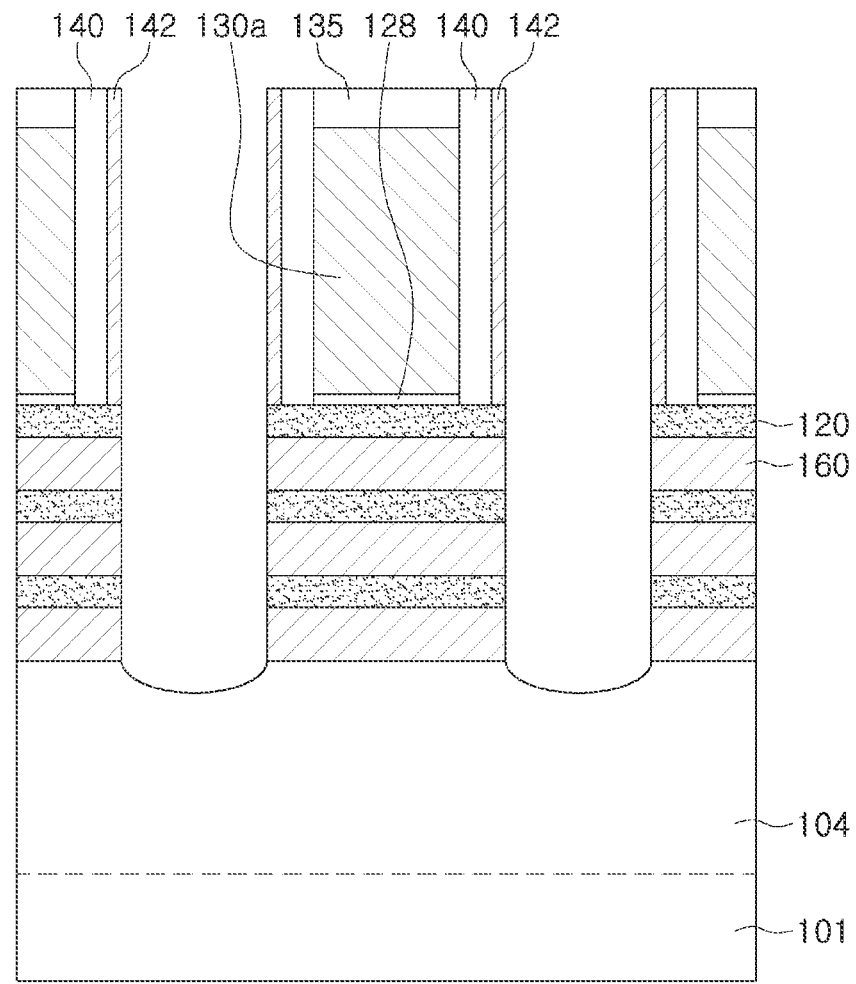

Referring to FIG. 11, recesses may be formed on both (e.g., opposing) sides of each of the dummy gates 130a by selectively removing portions of the fin structure FS, using the dummy gates 130a and the spacers 140 as an etching mask and using an anisotropic dry etching process.

As a result of the creation of the recesses on both sides of the dummy gates 130a, a plurality of channel layers 120 may be formed below the dummy gates 130a. Further, a plurality of sacrificial patterns 160 may be formed between the channel layers 120.

Portions of an upper surface of the substrate 101 may be exposed by the recesses. Portions of the upper surface of the substrate 101 may be etched by the anisotropic dry etching process.

Figure 12:
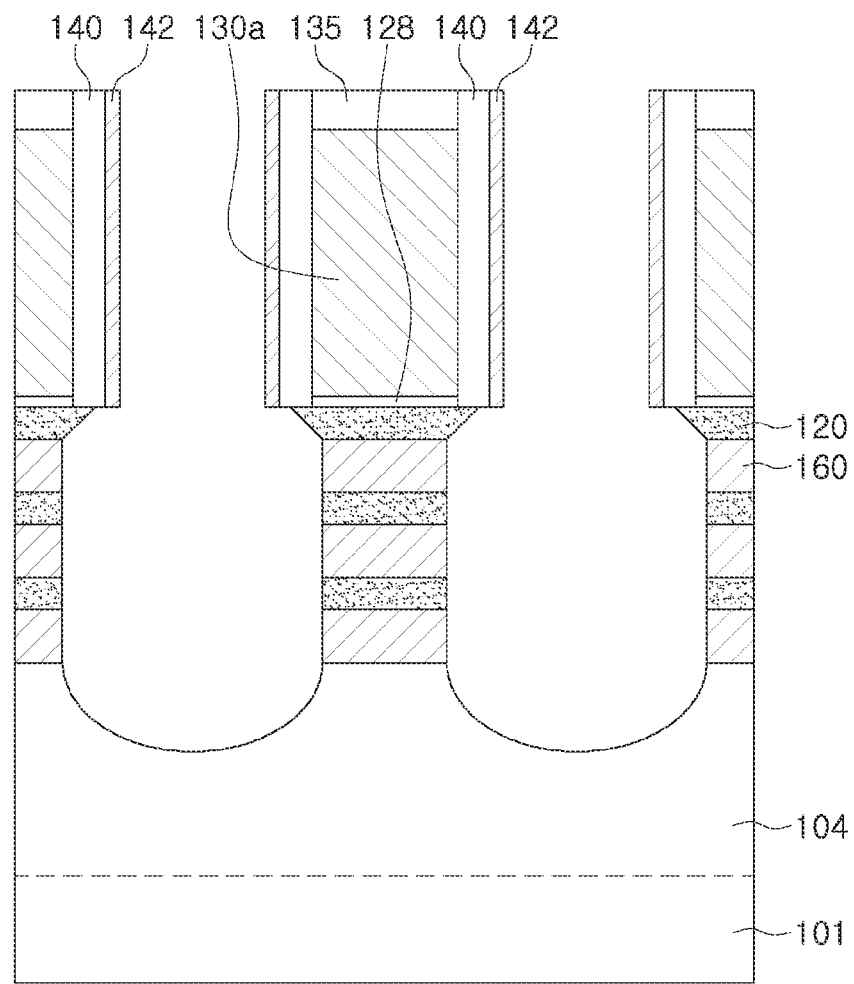

Referring to FIG. 12, the recesses may be expanded using an isotropic dry etching process.

The recesses formed on opposing sides of each of the dummy gates 130a may be expanded below the spacers 140 and the sacrificial spacers 142. Further, the portions of the upper surface of the substrate 101 exposed by the recesses may be etched.

A slope may be formed on lateral surfaces of a top channel layer 120 of the channel layers 120 by the isotropic dry etching process. A length (for example, a length in the X-axis direction) of the top channel layer 120 may decrease toward the substrate 101. In an example embodiment, a slope may also be formed on lateral surfaces of a bottom channel layer 120 of the channel layers 120 by the isotropic dry etching process. A length (for example, a length in the X-axis direction) of the bottom channel layer 120 may increase toward the substrate 101.

Figure 13:
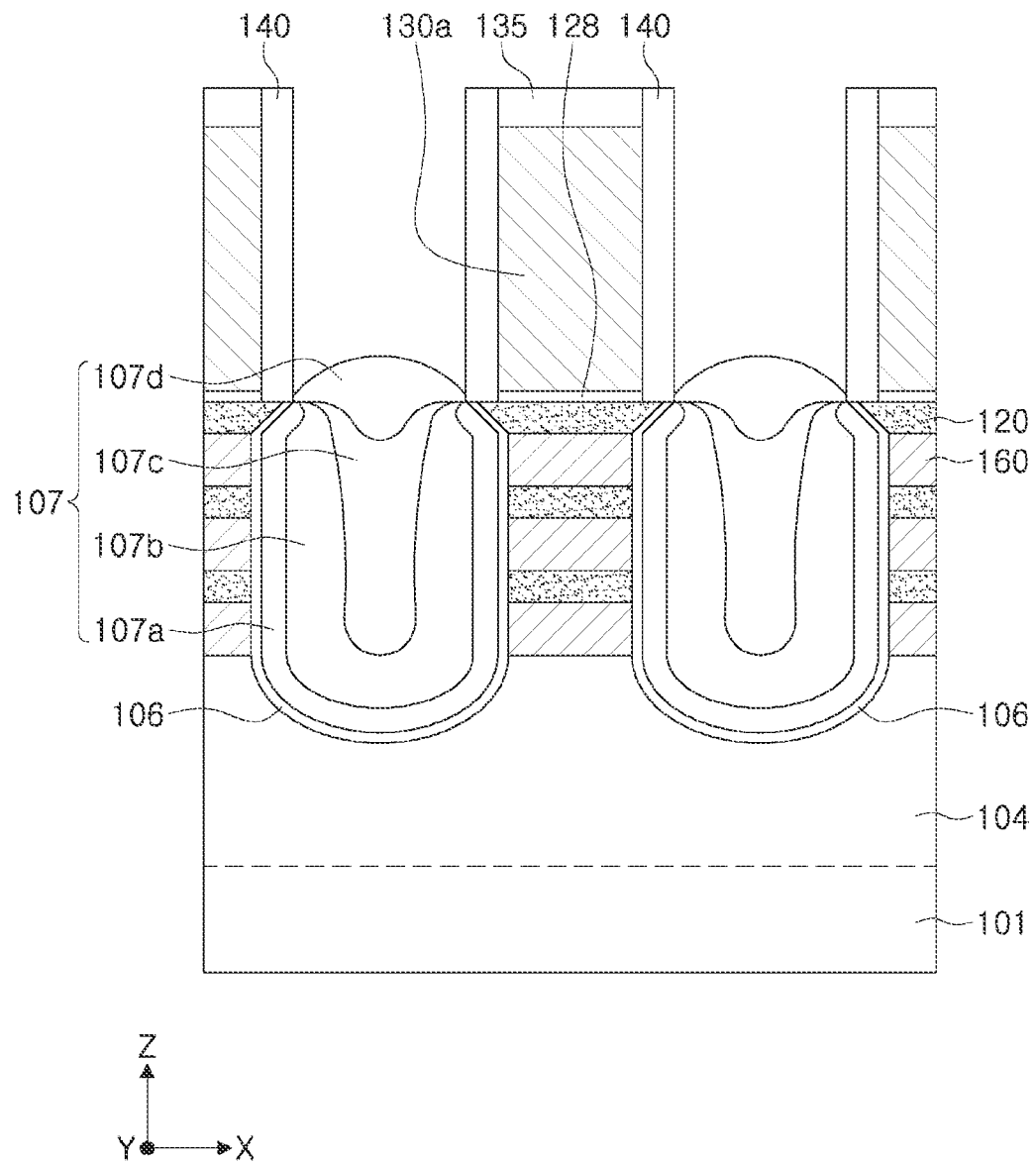

Referring to FIG. 13, embedded source/drain layers 107 may be formed from the upper surface of the substrate 101 within the expanded recesses, using a SEG process.

The sacrificial spacers 142 may be removed by a pre-cleaning process. Prior to forming the embedded source/drain layers 107, interfacial layers 106 may be formed within the recesses. The interfacial layers 106 may be formed by a baking process under a hydrogen ($H_2$) atmosphere.

The embedded source/drain layers 107 may be formed on the interfacial layers 106. Liner layers 107a may first be formed on the interfacial layers 106. First to third epitaxial layers 107b to 107d having different compositions may be sequentially formed on the liner layers 107a.

The liner layer 107a, the first epitaxial layer 107b, the second epitaxial layer 107c, and the third epitaxial layer 107d may be doped with, for example, p-type impurities. The p-type impurities may be injected in situ during a SEG process or by a following ion implantation process.

A thickness of the interfacial layer 106 may be less than that of the liner layer 107a. Thicknesses of the first to third epitaxial layers 107b to 107d may be variously changed.

Figure 14:
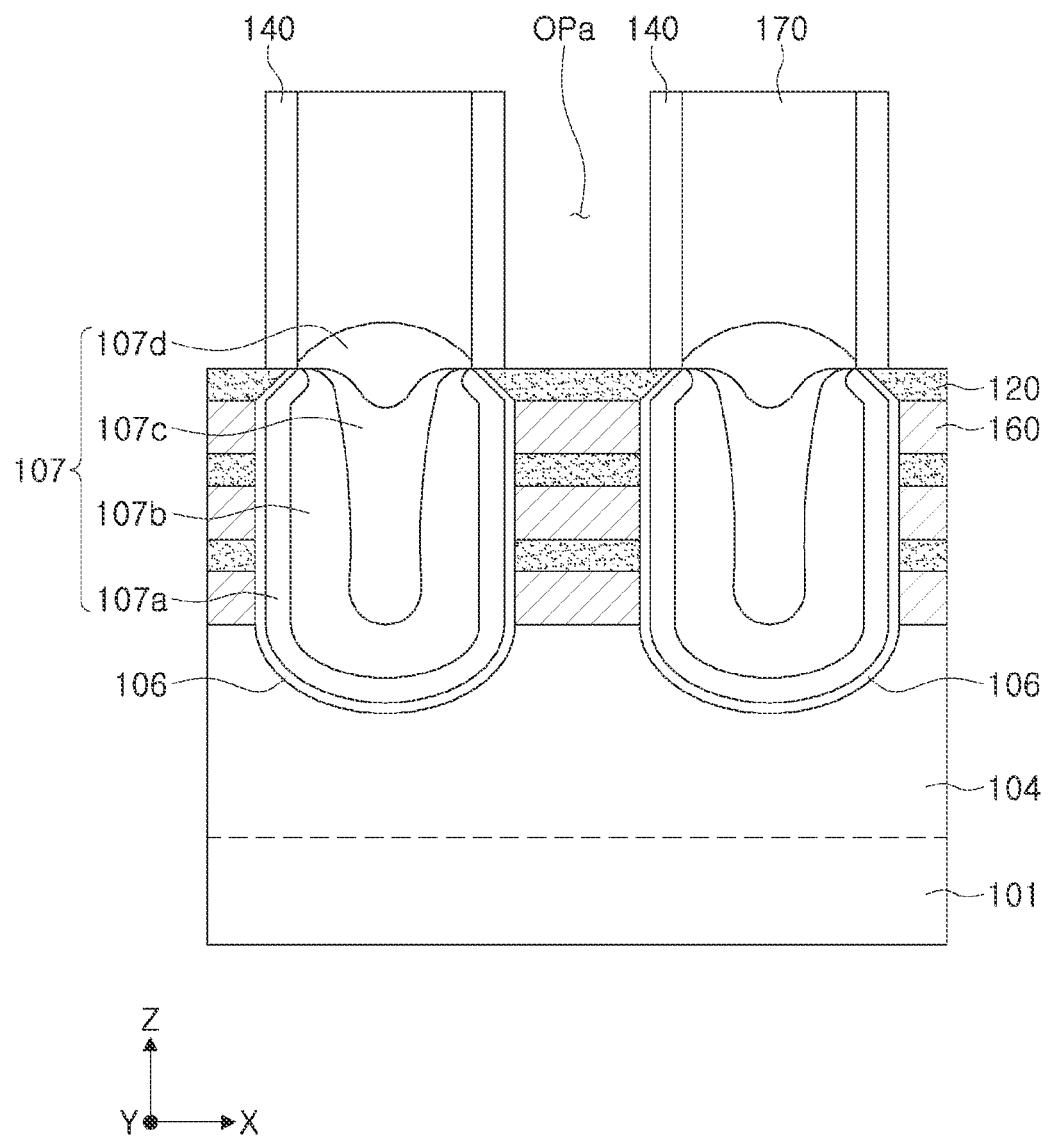

Referring to FIG. 14, a first opening portion OPa may be formed by removing the dummy gate 130a and the dummy insulating layer 128.

An interlayer insulating layer 170 may first be formed to cover the dummy gate 130a. The interlayer insulating layer 170 may be formed outside the spacers 140 to cover the embedded source/drain layers 107.

The interlayer insulating layer 170 may be formed by an insulating material coating process and a planarization process. The capping layer 135 may be removed and the dummy gate 130a may be exposed by the planarization process. The dummy gate 130a and the dummy insulating layer 128 may be sequentially removed.

Figure 15:
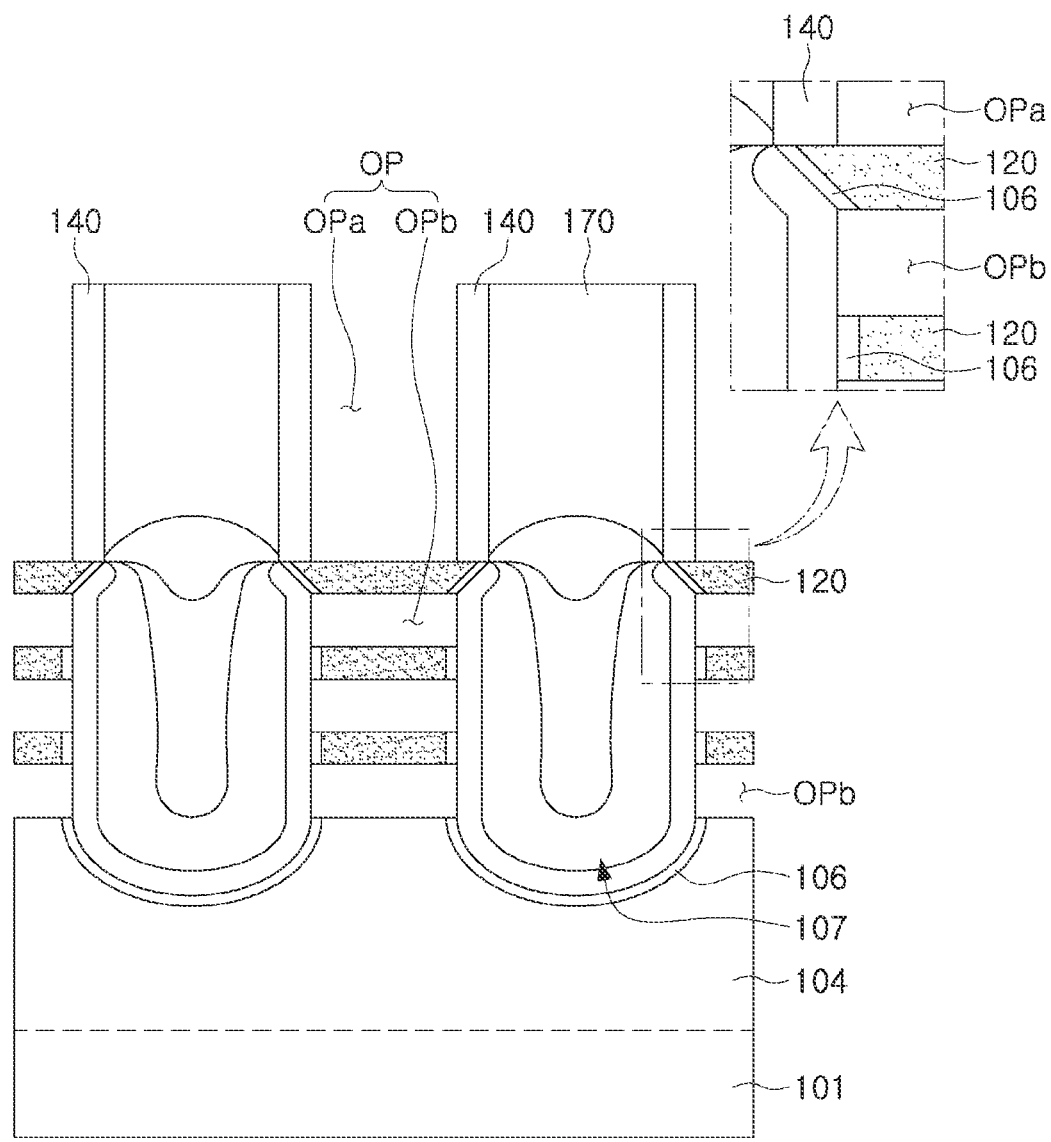

Referring to FIG. 15, a second opening portion OPb may be formed by selectively removing the sacrificial patterns 160. The first opening portion OPa and the second opening portion OPb may form an opening portion OP.

For example, the channel layers 120 may include Si, and the sacrificial patterns 160 may include SiGe. An etchant having an etching rate of SiGe higher than that of Si may be used to selectively remove the sacrificial patterns 160. For example, an etchant including hydrogen peroxide ($H_2O_2$), hydrofluoric acid (HF), and acetic acid ($CH_3COOH$), an etchant including ammonium hydroxide ($NH_4OH$), hydrogen peroxide ($H_2O_2$), and deionized water ($H_2O$), and an etchant including peracetic acid, or any combination thereof may be used.

When removing the sacrificial patterns 160, portions of the interfacial layers 106 contacting the sacrificial patterns 160 may be removed. A portion of the liner layer 107a may be exposed by the second opening portion OPb. When the liner layer 107a is formed of Si, the liner layer 107a may be prevented from being etched in the removing of the sacrificial patterns 160. Thus, a length of a gate electrode to be formed in a following process may be prevented from being increased in the first direction (for example, the X-axis direction).

Referring again to FIGS. 2 through 4, gate insulating layers 110 and gate electrodes 130 may be sequentially formed within the opening portion OP.

The gate insulating layers 110 may be formed on inner lateral surfaces of the spacers 140 exposed by the opening portion OP. The gate insulating layers 110 may be formed on surfaces of the channel layers 120 exposed by the opening portion OP and on surfaces of portions of the embedded source/drain layers 107. The gate insulating layers 110 may surround the channel layers 120. The gate insulating layer 110 may include a first insulating layer 111 and a second insulating layer 112 sequentially stacked and having different permittivities. The permittivity of the second insulating layer 112 may be greater than that of the first insulating layer 111.

The gate electrode 130 may be formed on the gate insulating layer 110. The gate electrode 130 may include a barrier metal layer 131, a work function metal layer 132, and a gate metal layer 133 sequentially stacked.

A protective layer 150 may be formed on the gate metal layer 133. The protective layer 150 may be formed, for example, of a silicon nitride. The protective layer 150 may prevent changes in a level of threshold voltage due to oxygen or the like permeating into the gate electrode 130. A portion of the gate electrode 130 may be removed, and the protective layer 150 may be formed within a region from which the portion of the gate electrode 130 has been removed.

As set forth above, according to example embodiments of the present inventive concepts, semiconductor devices having improved alternating current (AC) characteristics may be provided by reducing enlargement of the gate length thereof.

Also, example embodiments of the present inventive concepts may provide methods of manufacturing such improved semiconductor devices.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While example embodiments have been shown and described above, it will be apparent to those skilled in the art that modifications and variations could be made without departing from the scope of the present inventive concepts, as defined by the appended claims.

What is claimed is:

1. A semiconductor device, comprising:
a substrate;
a channel on the substrate;
a gate electrode extending on the channel; and
source/drain structures in recess regions on opposing sides of the gate electrode, the source/drain structures each comprising a first epitaxial layer and a second epitaxial layer on the first epitaxial layer,
wherein the second epitaxial layer is in a center region of each of the source/drain structures,
wherein the first epitaxial layer surrounds a bottom surface and both side surfaces of the second epitaxial layer,
wherein the side surfaces of the second epitaxial layer each comprise first portions that are inclined so that a width of the second epitaxial layer decreases toward the substrate,
wherein the second epitaxial layer fills more than half of each of the recess regions and comprises a recess portion in an upper surface thereof, and
wherein the second epitaxial layer has a first length in a first direction perpendicular to an upper surface of the substrate and has a second length, smaller than the first length, in a second direction perpendicular to the first direction.

2. The semiconductor device of claim 1, wherein the side surfaces of the second epitaxial layer further comprise:
second portions that are curved downwardly from upper portions of the first epitaxial layer and are connected to upper ends of the first portions; and
third portions that are curved from lower ends of the first portions.

3. The semiconductor device of claim 2, wherein a first width of the second epitaxial layer between the second portions is greater than a second width of a portion of the first epitaxial layer contacting the first portions of the second epitaxial layer on each of the side surfaces of the second epitaxial layer.

4. The semiconductor device of claim 2, wherein the second portions of the side surfaces of the second epitaxial layer and an upper surface of the second epitaxial layer are connected to form an angled shape toward outer surfaces of each the source/drain structures.

5. The semiconductor device of claim 2, wherein a surface of the first epitaxial layer contacting the second portions of the side surfaces of the second epitaxial layer comprises a curved portion.

6. The semiconductor device of claim 1, wherein the second epitaxial layer covers a portion of an upper surface of the first epitaxial layer.

7. The semiconductor device of claim 1, wherein the first epitaxial layer and the second epitaxial layer each comprise silicon germanium, and
wherein a germanium content of the second epitaxial layer is greater than a germanium content of the first epitaxial layer.

8. The semiconductor device of claim 1, wherein the source/drain structures further comprise a third epitaxial layer on the second epitaxial layer, and
wherein the first epitaxial layer includes 17 at % to 27 at % Ge, the second epitaxial layer includes 37 at % to 47 at % Ge, and the third epitaxial layer includes 50 at % to 60 at % Ge.

9. A semiconductor device, comprising:
a substrate;
a channel on the substrate;
a gate electrode on the channel, the gate electrode extending in a first direction;
source/drain structures on opposing sides of the gate electrode, the source/drain structures each comprising a first epitaxial layer, a second epitaxial layer on the first epitaxial layer, and a third epitaxial layer on the second epitaxial layer; and spacers on side surfaces of the gate electrode, the spacers being in contact with the third epitaxial layer, wherein the first epitaxial layer surrounds a bottom surface and side surfaces of the second epitaxial layer, wherein the side surfaces of the second epitaxial layer comprise first portions that are inclined so that a width of the second epitaxial layer decreases toward the substrate, second portions that are curved downwardly from upper portions of the first epitaxial layer and are connected to upper ends of the first portions, third portions curved from lower ends of the first portions, wherein a first width of the second epitaxial layer between the second portions is greater than a second width of a portion of the first epitaxial layer contacting the first portions of the second epitaxial layer on each of the side surfaces of the second epitaxial layer, wherein at least one of the source/drain structures comprises an upper portion having a convex shape protruding upwardly to a level higher than an upper surface of the channel, wherein the at least one of the source/drain structures comprises a middle portion below the upper portion, wherein a width of the upper portion in a second direction perpendicular to the first direction is smaller than a width of the middle portion in the second direction, wherein the third epitaxial layer comprises a convex upper surface.

10. The semiconductor device of claim 9, wherein the first epitaxial layer includes 17 at % to 27 at % Ge, the second epitaxial layer includes 37 at % to 47 at % Ge, and the third epitaxial layer includes 50 at % to 60 at % Ge.

11. The semiconductor device of claim 9, wherein the second portions of the side surfaces of the second epitaxial layer and an upper surface of the second epitaxial layer are connected to form an angled shape toward outer surfaces of each the source/drain structures.

12. A semiconductor device, comprising:
a substrate;
a channel on the substrate;
a gate electrode on the channel; and
source/drain structures on opposing sides of the gate electrode, the source/drain structures each comprising a first epitaxial layer and a second epitaxial layer having different compositions from each other,
wherein the second epitaxial layer is in a center region of each of the source/drain structures,
wherein the first epitaxial layer surrounds a bottom surface and both side surfaces of the second epitaxial layer,
wherein the side surfaces of the second epitaxial layer each comprise first portions that are inclined so that a width of the second epitaxial layer decreases toward the substrate and second portions that are curved downwardly from upper portions of the first epitaxial layer and are connected to upper ends of the first portions, and
wherein the first epitaxial layer comprises outer side surfaces having substantially vertical portions.

13. The semiconductor device of claim 12, wherein a first width of the second epitaxial layer between the second portions is greater than a second width of a portion of the first epitaxial layer contacting the first portions of the second epitaxial layer on each of the side surfaces of the second epitaxial layer.

14. The semiconductor device of claim 12, wherein the second portions of the side surfaces of the second epitaxial layer and an upper surface of the second epitaxial layer are connected to form an angled shape toward outer surfaces of each the source/drain structures.

15. The semiconductor device of claim 12, wherein a surface of the first epitaxial layer contacting the second portions of the side surfaces of the second epitaxial layer comprises a curved portion.

16. The semiconductor device of claim 12, wherein an upper surface of the second epitaxial layer comprises a recessed portion.

17. The semiconductor device of claim 12, wherein the source/drain structures further comprise a third epitaxial layer on the second epitaxial layer, and
wherein the first epitaxial layer includes 17 at % to 27 at % Ge, the second epitaxial layer includes 37 at % to 47 at % Ge, and the third epitaxial layer includes 50 at % to 60 at % Ge.

18. The semiconductor device of claim 12, wherein the second epitaxial layer fills more than half of each of recess regions in which the source/drain structures are located, and
wherein the second epitaxial layer has a first length in a first direction perpendicular to an upper surface of the substrate and has a second length, smaller than the first length, in a second direction perpendicular to the first direction.

* * * * *